(12) United States Patent
Cheng

(10) Patent No.: US 11,943,979 B2
(45) Date of Patent: Mar. 26, 2024

(54) ARRAY SUBSTRATE AND FABRICATION METHOD THEREOF, ARRAY SUBSTRATE MOTHERBOARD AND DISPLAY DEVICE

(71) Applicant: BOE TECHNOLOGY GROUP CO., LTD., Beijing (CN)

(72) Inventor: Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/706,901

(22) Filed: Mar. 29, 2022

(65) Prior Publication Data

US 2022/0223678 A1    Jul. 14, 2022

Related U.S. Application Data

(63) Continuation of application No. 16/609,842, filed as application No. PCT/CN2019/084619 on Apr. 26, 2019, now Pat. No. 11,374,083.

(30) Foreign Application Priority Data

Jun. 12, 2018  (CN) .......................... 201810602404.6

(51) Int. Cl.
*H10K 59/131* (2023.01)
*H01L 27/02* (2006.01)
*H10K 59/12* (2023.01)

(52) U.S. Cl.
CPC ....... *H10K 59/131* (2023.02); *H01L 27/0296* (2013.01); *H10K 59/1201* (2023.02)

(58) Field of Classification Search
CPC .................................................. H10K 59/131
See application file for complete search history.

(56) References Cited

U.S. PATENT DOCUMENTS 7,956,945 B2    6/2011  Kim
9,508,751 B2 *  11/2016 Cai ........................ H01L 27/124
(Continued)

FOREIGN PATENT DOCUMENTS

CA          2228214 A1    2/1997
CN        101604103 A    12/2009
(Continued)

OTHER PUBLICATIONS

Non-Final Office Action issued for U.S. Appl. No. 16/609,842, dated Sep. 27, 2021, 13 pages.
(Continued)

*Primary Examiner* — Benjamin P Sandvik
(74) *Attorney, Agent, or Firm* — Dave Law Group LLC; Raj S. Dave

(57) ABSTRACT

An array substrate and a fabrication method thereof, an array substrate motherboard, and a display device are disclosed. The array substrate includes a display region and a bonding region outside the display region. The array substrate further includes: a bonding electrode, located in the bonding region and spaced apart from an outer edge of the bonding region; and an electrostatic barrier line, the electrostatic barrier line has one end electrically connected with the bonding electrode, and the other end extends to the outer edge of the bonding region, and resistivity of the electrostatic barrier line is greater than resistivity of the bonding electrode.

7 Claims, 9 Drawing Sheets

(56) References Cited

U.S. PATENT DOCUMENTS

| | | | |
|---|---|---|---|
| 2006/0067143 | A1 | 3/2006 | Kim |
| 2008/0173871 | A1 | 7/2008 | Noda et al. |
| 2009/0294771 | A1 | 12/2009 | Kim et al. |
| 2011/0096449 | A1 | 4/2011 | Lee et al. |
| 2015/0008432 | A1* | 1/2015 | Kim .................. H01L 27/1255 257/48 |
| 2015/0144915 | A1 | 5/2015 | Lee |
| 2015/0359078 | A1 | 12/2015 | Zhang et al. |
| 2018/0108649 | A1 | 4/2018 | Cheng |

FOREIGN PATENT DOCUMENTS

| | | | |
|---|---|---|---|
| CN | 103021945 | A | 4/2013 |
| CN | 106972008 | A | 7/2017 |
| CN | 1740881 | A | 12/2017 |
| CN | 208336226 | U | 1/2019 |
| JP | 08022024 | A | 1/1996 |
| JP | 2000010116 | A | 1/2000 |
| JP | 2001166327 | A | 6/2001 |
| JP | 2005352419 | A | 12/2005 |
| JP | 2009301032 | A | 12/2009 |
| JP | 2014130349 | A | 7/2014 |
| JP | 2015111191 | A | 6/2015 |
| JP | 2017120775 | A | 7/2017 |
| JP | 2001281687 | A | 4/2022 |
| KR | 1020050069869 | A | 7/2005 |
| KR | 20040021069 | A | 4/2015 |
| KR | 101595448 | B1 | 2/2016 |
| KR | 101748698 | B1 | 7/2017 |

OTHER PUBLICATIONS

Final Office Action issued for U.S. Appl. No. 16/609,842, dated Dec. 29, 2021, 14 pages.
Notice of Allowance issued for U.S. Appl. No. 16/609,842, dated Mar. 2, 2022, 10 pages.
Examination Report mailed on for Indian Patent Application No. 201917046663, dated Mar. 12, 2021, 6 pages.
Non-Final Office Action Issued for U.S. Appl. No. 16/609,842, dated Dec. 27, 2021, 14 pages.
Final Office Action issued for U.S. Appl. No. 16/609,842, dated Sep. 29, 2021, 14 pages.
Office action issued for Japanese Patent Application No. 2019-559760, dated Jan. 31, 2023, 16 pages.
Office Action issued for Chinese Application No. 201810602404.6 dated Nov. 5, 2023, 15 pages.
First Office Action issued for Chineese Application No. 201810602404.6 dated Nov. 5, 2023, 15 pages.

* cited by examiner

ARRAY SUBSTRATE AND FABRICATION METHOD THEREOF, ARRAY SUBSTRATE MOTHERBOARD AND DISPLAY DEVICE

CROSS REFERENCE TO RELATED APPLICATIONS

The present application is the continuation of U.S. patent application Ser. No. 16/609,842, filed on Oct. 31, 2019, which is the U.S. national stage of International Patent Application No. PCT/CN2019/084619, filed on Apr. 26, 2019, which claims priority to Chinese patent application No. 201810602404.6, filed on Jun. 12, 2018, the entire disclosures of which are incorporated herein by reference as part of the present application.

TECHNICAL FIELD

Embodiments of the present disclosure relate to an array substrate motherboard and a fabrication method thereof, an array substrate and a fabrication method thereof, and a display device.

BACKGROUND

An array substrate is one of core components of an active-drive type display device. The array substrate is provided thereon with thin film transistors arranged in a matrix. The thin film transistor is used to drive a corresponding sub-pixel to be turned on or off for display. The array substrate is further arranged thereon with various signal lines, for supplying various electrical signals required for display of the sub-pixel.

During fabrication processes of the array substrate and the display device and an operation process of the display device, a large amount of static electricity is generated inside the array substrate, and accumulation of the static electricity is highly prone to an electric discharge phenomenon, so as to easily damage internal components and circuit structures of the array substrate; especially for a high-resolution display device, the higher the wiring density on the array substrate, the more serious the above-described phenomenon.

SUMMARY

According to an embodiment of the present disclosure, there is provided an array substrate. The array substrate comprising a display region and a bonding region located outside the display region. The array substrate further comprising: a bonding electrode, located in the bonding region and spaced apart from an outer edge of the bonding region; and an electrostatic barrier line, the electrostatic barrier line has one end electrically connected with the bonding electrode, and the other end extends to the outer edge of the bonding region, and resistivity of the electrostatic barrier line is larger than resistivity of the bonding electrode.

As an example, the array substrate comprises a plurality of bonding electrodes and a plurality of electrostatic barrier lines, and the plurality of bonding electrodes are electrically connected with the plurality of electrostatic barrier lines in one-to-one manner.

As an example, the array substrate further comprising a base substrate and an active layer located on the base substrate, wherein the electrostatic barrier line and the active layer are provided in a same layer and made of a same material.

As an example, the array substrate further comprising a source/drain metal layer and a gate metal layer located on the base substrate, wherein the bonding electrode and the source/drain metal layer are provided in a same layer and made of a same material; or the bonding electrode and the gate metal layer are provided in a same layer and made of a same material.

As an example, the source/drain metal layer is provided on a side of the active layer that faces away from the base substrate, and the gate metal layer is provided between the active layer and the source/drain metal layer; the array substrate further comprises a gate insulating layer provided between the active layer and the gate metal layer, and an interlayer insulating layer provided between the gate metal layer and the source/drain metal layer; the bonding electrode and the source/drain metal layer are provided in a same layer and made of a same material, and a first via hole is provided in the gate insulating layer and the interlayer insulating layer; or, the bonding electrode and the gate metal layer are provided in a same layer and made of a same material, and a first via hole is provided in the gate insulating layer; the bonding electrode is electrically connected with the electrostatic barrier line through the first via hole.

As an example, the electrostatic barrier line comprises at least one of a fold line, a curved line, or a straight line.

According to an embodiment of the present disclosure, there is provided a display panel, the display panel comprising the afore-mentioned array substrate.

According to an embodiment of the present disclosure, there is provided a display device, the display device comprising the afore-mentioned array substrate.

According to an embodiment of the present disclosure, there is provided a fabrication method of an array substrate, the array substrate comprising a display region and a bonding region outside the display region, the fabrication method comprising: forming a bonding electrode, the bonding electrode being located in the bonding region and spaced apart from an outer edge of the bonding region; and forming an electrostatic barrier line, the electrostatic barrier line has one end electrically connected with the bonding electrode, and the other end extends to the outer edge of the bonding region, and resistivity of the electrostatic barrier line is larger than resistivity of the bonding electrode.

As an example, the fabrication method comprises: forming a semiconductor thin film on a base substrate; patterning the semiconductor thin film to form an active layer and the electrostatic barrier line; performing ion implantation on a source region and a drain region of the active layer as well as the electrostatic barrier line.

As an example, after the patterning the semiconductor thin film and before the performing ion implantation, the method further comprises: forming a gate insulating layer on a side of the active layer and the electrostatic barrier line that faces away from the base substrate; forming a gate metal layer on a side of the gate insulating layer that faces away from the base substrate; patterning the gate metal layer to form a gate electrode, and wherein the performing ion implantation comprises: performing ion implantation by using the gate electrode as a mask.

As an example, forming the bonding electrode at a same time of patterning the gate metal layer to form the gate electrode; the fabrication method further comprises: forming a first via hole in the gate insulating layer, the bonding electrode being electrically connected with the electrostatic barrier line through the first via hole.

As an example, the fabrication method further comprises: forming an interlayer insulating layer on a side of the gate electrode that faces away from the base substrate; forming a source/drain metal layer on a side of the interlayer insulating layer that faces away from the base substrate; patterning the source/drain metal layer to form a source electrode, a drain electrode and the bonding electrode; and forming a first via hole in the interlayer insulating layer and the gate insulating layer, the bonding electrode being electrically connected with the electrostatic barrier line through the first via hole.

According to an embodiment of the present disclosure, there is provided an array substrate motherboard, the array substrate motherboard comprising an array structure, the array structure comprising a display region and a bonding region outside the display region, the array structure further comprising: a bonding electrode, located in the bonding region and spaced apart from an outer edge of the bonding region; and an electrostatic barrier line, the electrostatic barrier line having one end electrically connected with the bonding electrode, and the other end extending to the outer edge of the bonding region, and resistivity of the electrostatic barrier line being larger than resistivity of the bonding electrode.

As an example, the array structure comprises a plurality of bonding electrodes and a plurality of electrostatic barrier lines; and the plurality of bonding electrodes are electrically connected with the plurality of electrostatic barrier lines in one-to-one manner.

As an example, the array substrate motherboard further comprises an electrostatic protection line; in a direction parallel to the array substrate motherboard, the electrostatic protection line is spaced apart from the array structure, and the electrostatic barrier line is electrically connected with the electrostatic protection line.

As an example, the array substrate motherboard comprising a plurality of array structures, wherein the plurality of array structures are arranged in a line, and a line direction of the plurality of array structures is parallel to a length direction of the electrostatic protection line.

As an example, the electrostatic protection line is provided corresponding to a line of array structures, a bonding region of each array structure in the line of array structures is provided at a side close to the electrostatic protection line; and electrostatic barrier lines of each array structure in the line of array structures are electrically connected with the electrostatic protection line.

As an example, the electrostatic protection line is provided corresponding to two lines of array structures and provided between the two lines of array structures; a bonding region of each array structure in the two lines of array structures is at a side close to the electrostatic protection line, and electrostatic barrier lines of each array structure in the two lines of the array structures are electrically connected with the electrostatic protection line.

As an example, the array substrate motherboard comprises a plurality of array structures, wherein among the plurality of array structures, electrostatic barrier lines of one array structure are electrically connected with electrostatic barrier lines of another array structure.

As an example, the plurality of array structures are arranged in at least two lines and comprising a first line of array structures and a second line of array structures adjacent to each other; a bonding region of each array structure in the first line of array structures is provided at a side close to the second line of array structures; a bonding region of each array structure in the second line of array structures is provided at a side close to the first line of array structures; and bonding regions of the first line of array structures and bonding regions of the second line of array structures are respectively electrically connected in a one-to-one manner through same electrostatic barrier lines.

As an example, the array substrate motherboard further comprises a base substrate, an active layer, a source/drain metal layer and a gate metal layer, wherein the active layer, the source/drain metal layer and the gate metal layer are located on the base substrate, wherein the electrostatic barrier line and the active layer are provided in a same layer and made of a same material, and wherein the bonding electrode and one of the source/drain metal layer and the gate metal layer are provided in a same layer and made of a same material.

As an example, the array substrate motherboard further comprises a base substrate, an active layer, a source/drain metal layer and a gate metal layer, wherein the active layer, the source/drain metal layer and the gate metal layer are located on the base substrate, wherein the electrostatic barrier line and the active layer are provided in a same layer and made of a same material, and wherein the electrostatic protection line and one of the source/drain metal layer and the gate metal layer are provided in a same layer and made of a same material.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
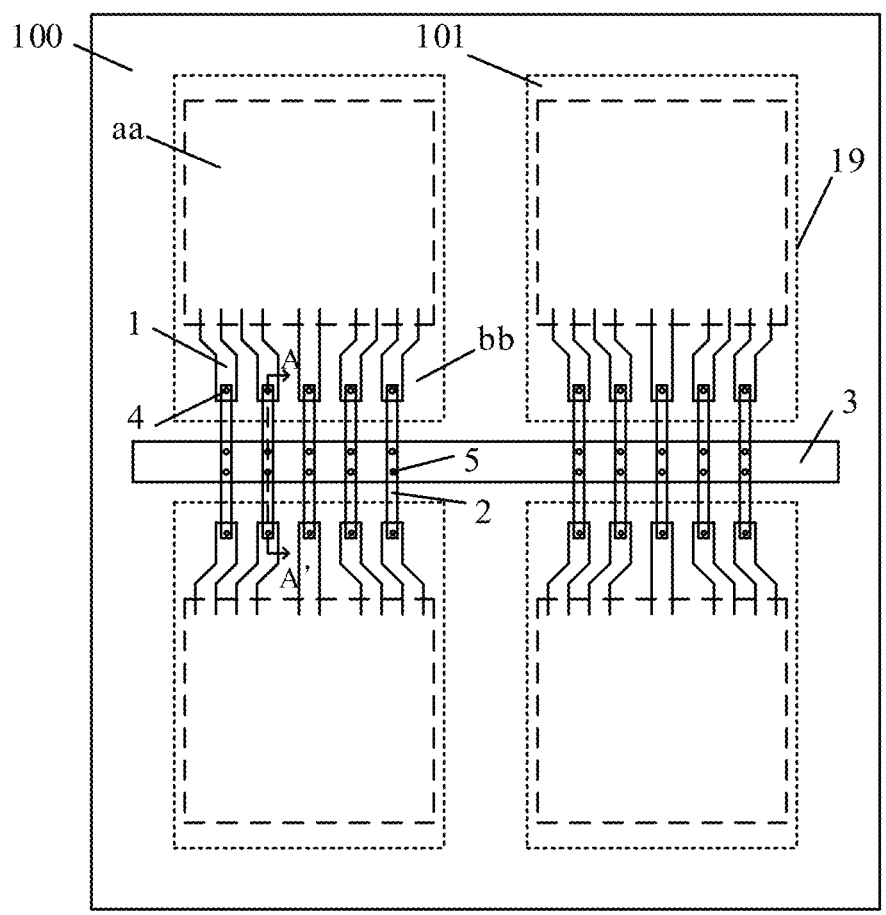
FIG. 1 is a plan structural view of an array substrate motherboard provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Static electricity builds up inside an array substrate, which can easily damage an internal structure of the array substrate; and it is even worse for a high-resolution display device. For example, an electrostatic protection line is provided between the array structures in two adjacent lines of an array substrate motherboard, and then bonding electrodes in bonding regions of respective array structures are extended to the electrostatic protection line, so that static electricity inside the array structures can flow to the electrostatic protection line through the bonding electrodes. Such a structure can alleviate the phenomenon of static electricity accumulation at an end portion of the bonding electrode to a certain extent. However, after the array substrate motherboard is cut into several array substrate, the electrostatic protection line is also cut off and the bonding electrode on a single array substrate extends to an edge of a bonding region, that is, an edge of the single array substrate, in this case, static electricity from the bonding electrode is prone to enter the single array substrate at the edge of the array substrate during a subsequent production and operation process, so as to aggravate damage to the internal structure of the array substrate caused by the static electricity.

Figure 2:
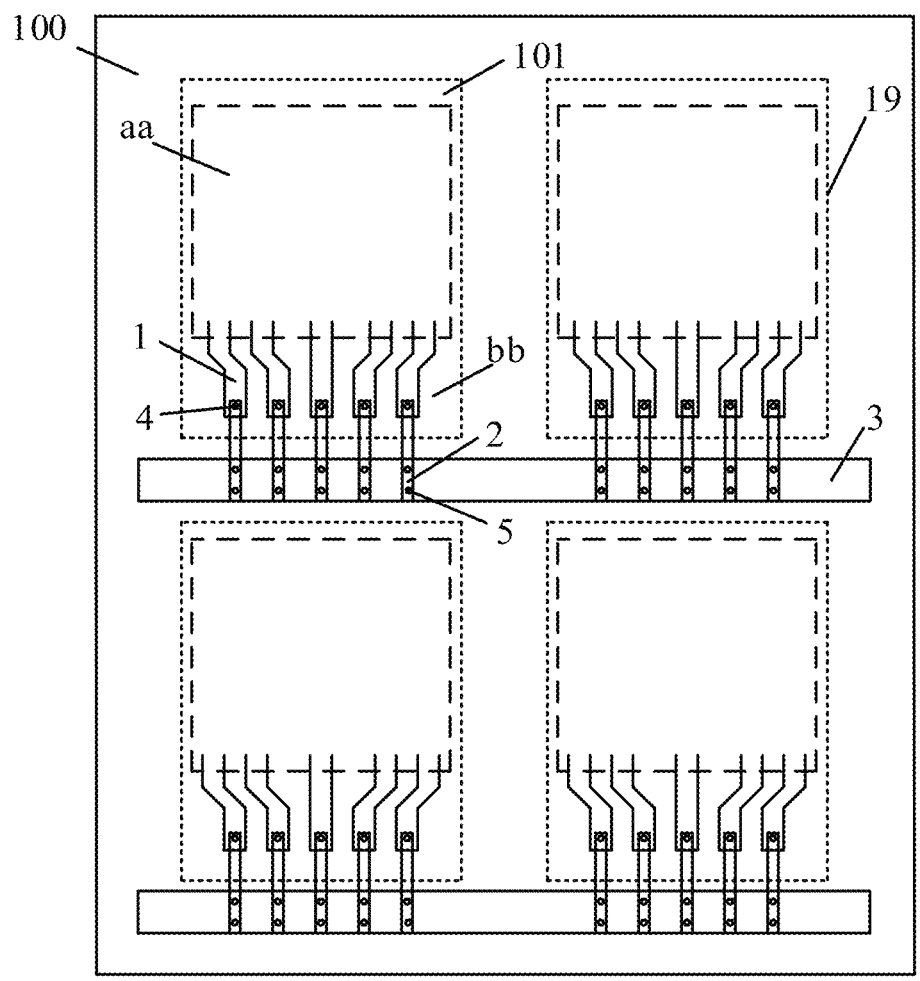
FIG. 2 is another plan structural view of the array substrate motherboard provided by the embodiment of the present disclosure.

An embodiment of the present disclosure provides an array substrate motherboard. As illustrated in FIG. 1 and FIG. 2, the array substrate motherboard comprises an array structure 101; the array structure 101 includes a display region aa and a bonding region bb, the bonding region bb is located outside the display region aa. The bonding region bb is provided with a bonding electrode 1, and the bonding electrode 1 is spaced apart from an outer edge of the bonding region bb. The bonding region bb is further provided with an electrostatic barrier line 2, and the electrostatic barrier line 2 has one end electrically connected with the bonding electrode 1, and the other end extending to the outer edge of the bonding region bb, that is, extending to an edge of the array structure 101, and resistivity of the electrostatic barrier line 2 is larger than resistivity of the bonding electrode 1.

For example, the array substrate motherboard comprises a plurality of array structures. For example, after the array substrate motherboard is cut, a plurality of array substrates are obtained, and the plurality of array substrates respectively correspond to the above-described plurality of array structures 101, that is, one array structure 101 forms one array substrate.

For example, in a direction parallel to the array substrate motherboard, the bonding electrode 1 is spaced apart from the outer edge of the bonding region bb.

For example, the bonding region bb has an outer edge and an inner edge, and the inner edge of the bonding region bb is located between the display region aa and the outer edge of the bonding region bb. Therefore, the outer edge of the bonding region bb is an edge of the bonding region bb that is close to the edge of the array structure. For example, the outer edge of the bonding region bb is flush with the edge of the array structure.

As compared with the structure that the bonding electrode is directly extended to the outer edge of the bonding region, in the embodiment of the present disclosure, it is the electrostatic barrier line 2 that extends to the outer edge of the bonding region bb, and the resistivity of the electrostatic barrier line 2 is larger than that of the bonding electrode 1. After the array substrate motherboard is cut into a plurality of array substrates, the electrostatic barrier line 2 blocks external static electricity, so as to prevent the static electricity from entering the inside of the array substrate from the edge of the array substrate, which reduces an amount of static electricity inside the array substrate, and facilitates alleviating damage to the internal structure of the array substrate caused by the static electricity.

In addition, in the structure that the bonding electrode is directly extended to the outer edge of the bonding region, when static electricity is generated inside the array structure, the static electricity is easier to accumulate at an end portion of a line or an element, for example, accumulate at an end portion of the bonding electrode. According to the embodiment of the present disclosure, the electrostatic barrier line 2 extends to the outer edge of the bonding region bb, such that the electrostatic barrier line 2 can disperse the static electricity generated inside the array structure 101, to effectively prevent the static electricity from accumulating at the end portion of the bonding electrode 1, which thus can reduce a risk of damage to the internal structure of the array substrate 101 caused by the static electricity.

For example, as a possible design, referring to FIG. 1, a plurality of bonding electrodes 1 are provided in a bonding region bb of each array structure 101, and accordingly, a plurality of electrostatic barrier lines 2 are provided. The plurality of bonding electrodes 1 are electrically connected with the plurality of electrostatic barrier lines 2 in a one-to-one manner, that is, each of the bonding electrodes 1 is protected by an electrostatic barrier line 2. In this way, the electrostatic barrier line 2 can more completely prevents external static electricity from entering the array structure 101, and simultaneously disperse static electricity on each bonding electrode 1.

Further, as illustrated in FIG. 1 and FIG. 2, the array substrate motherboard further comprises an electrostatic protection line 3, the electrostatic protection line 3 is provided between the plurality of array structures 101, in this case, the electrostatic barrier line 2 is electrically connected with the electrostatic protection line 3, so that the static electricity generated inside the array structure 101 can be further dispersed into the electrostatic protection line 3. For example, the electrostatic protection line 3 is set to be spaced apart from each array structure 101 in the direction parallel to the array substrate motherboard, so that the array structure 101 is not damaged during a subsequent process of cutting off the electrostatic protection line 3.

For example, as illustrated in FIG. 1, the plurality of array structures 101 on the array substrate motherboard are arranged in at least two lines (the "line" described herein may be a row, or may be a column). For example, a line direction of each line of array substrate is parallel to a length direction of the electrostatic protection line 3. For example, an electrostatic protection line 3 is provided corresponding to two lines of the array structures 101, and bonding regions bb of the array structures 101 in two lines of array structures 101 corresponding to the electrostatic protection line 3 are opposite to each other (that is, the bonding regions bb of the array structures 101 in each line of array structure 101 are arranged at a side close to the electrostatic protection line 3). For example, the electrostatic protection line 3 is provided between the two lines of the corresponding array structures 101 and electrically connected with electrostatic barrier lines 2 of each array structure in the corresponding two lines of array structures 101. With such a design, electrostatic barrier lines 2 of respective array structures 101 are electrically connected with a same electrostatic protection line 3, so that electrostatic barrier lines 2 of respective array structures 101 can implement mutual charge circulation through a same electrostatic protection line 3, which facilitates dispersion of static electricity more.

For example, as illustrated in FIG. 2, an electrostatic protection line 3 is provided corresponding to one line of array structures 101; a bonding region bb of each array structure in the one line of array structures 101 is provided at a side close to the electrostatic protection line 3; and the electrostatic protection line 3 is electrically connected with electrostatic barrier lines 2 of each array substrate in the corresponding one line of array structures 101.

Figure 8:
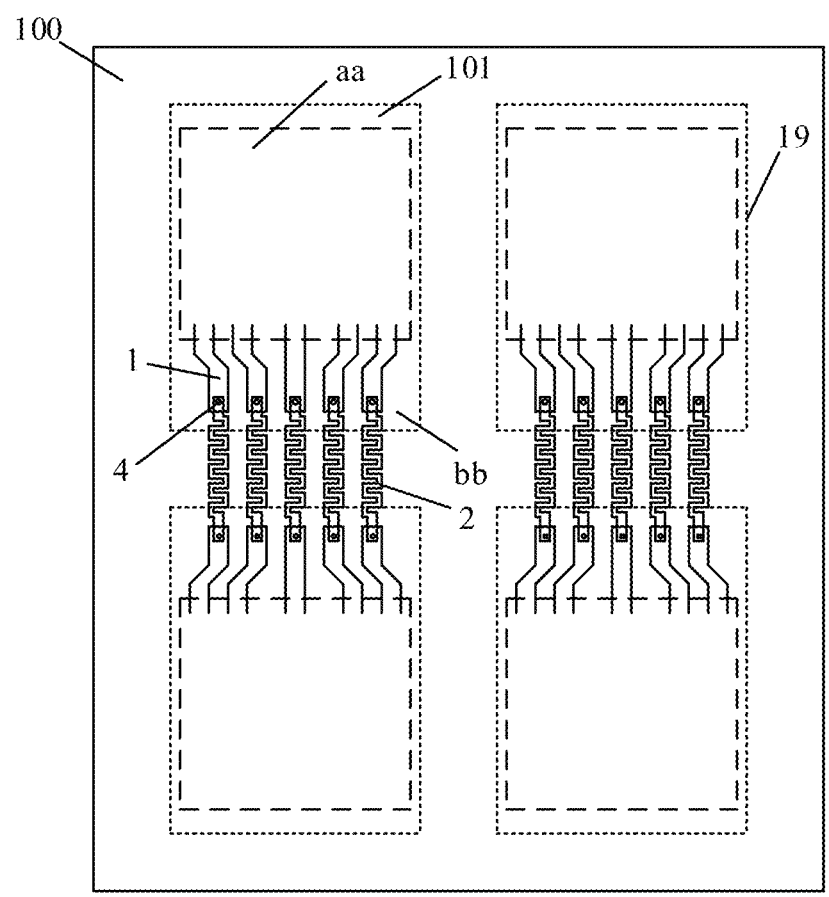
FIG. 8 is yet another plan structural view of the array substrate motherboard provided by the embodiment of the present disclosure.
Figure 9:
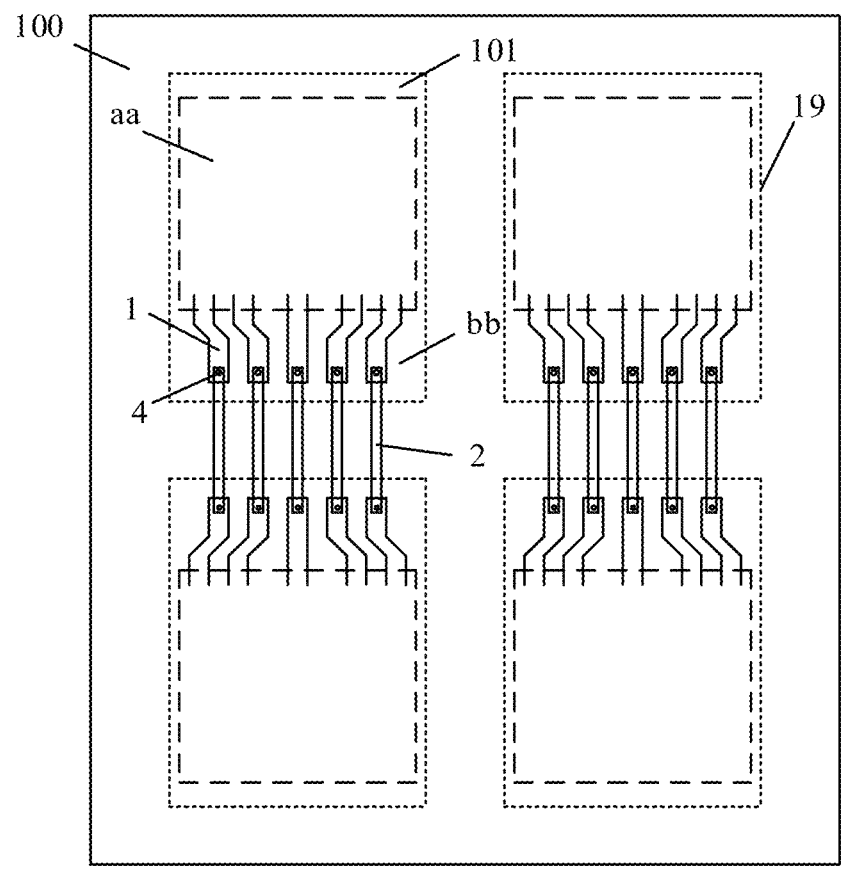
FIG. 9 is another plan structural view of the array substrate motherboard provided by the embodiment of the present disclosure.

For example, as illustrated in FIG. 8 and FIG. 9, electrostatic barrier lines 2 of one array structure 101 on the array substrate motherboard are configured to be electrically connected with electrostatic barrier lines 2 of another array structure 101, so that charge circulation is implemented between different array structures 101 through the electrostatic barrier lines 2, which facilitates dispersion of static electricity. In this case, the electrostatic protection line 3 may not be provided. Further, for example, a plurality of electrostatic barrier lines 2 of one array structure 101 on the array substrate motherboard are configured to be electrically connected with a plurality of electrostatic barrier lines 2 of another array structure 101 in a one-to-one manner.

For example, with reference to FIG. 9 again, the plurality of array structures 101 are arranged in at least two lines and include a first line of array structures (e.g., an upper line of array structures as illustrated in the diagram) and a second line of array structures (e.g., a lower line of array structures as illustrated in the diagram) adjacent to each other. A bonding region bb of each array structure in the first line of array structures is provided at a side close to the second line of array structures, and a bonding region bb of each array structure in the second line of array structures is provided at a side close to the first line of array structures. Bonding regions bb of the first line of array structures are electrically connected with bonding regions bb of the second line of array structures in a one-to-one manner through same electrostatic barrier lines 2. In this way, charge circulation can be implemented between the first line of array structures and the second line of array structures through the electrostatic barrier lines 2, which facilitates dispersion of static electricity.

Figure 3:
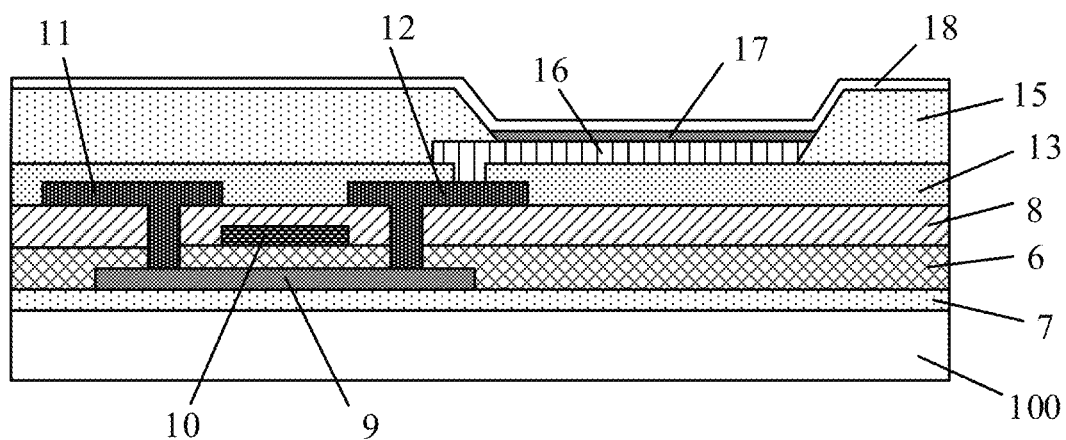
FIG. 3 is a cross-sectional structural view of a display region of an array structure of the array substrate motherboard provided by the embodiment of the present disclosure.

As illustrated in FIG. 3, the array substrate motherboard comprises: a base substrate 100, a buffer layer 7, an active layer 9, a gate insulating layer 6, a gate metal layer, an interlayer insulating layer 8 and a source/drain metal layer. The gate metal layer comprises a gate electrode 10, and the source/drain metal layer comprises a source electrode 11 and a drain electrode 12. The gate electrode 10 is located on a side of the active layer 9 that faces away from the base substrate 100, and such a structure is referred to as a "top gate" structure. It should be noted that, in the embodiment of the present disclosure, it is described with the "top gate" structure as an example, but this does not constitute a limitation to the technical solution provided by the present disclosure. In other embodiment of the present disclosure, an array substrate motherboard may also have a "bottom gate" structure or other structure. In the "bottom gate" structure, a gate electrode 10 is located on a side of an active layer 9 that is close to a base substrate 100.

For example, the source electrode 11, the drain electrode 12, the active layer 9 and the gate electrode 10 together constitute a thin film transistor, and the thin film transistor may be located in the display region aa, as illustrated in FIG. 3.

For example, as illustrated in FIG. 3, FIG. 4, FIG. 5, FIG. 6a and FIG. 6b, the electrostatic barrier line 2 may be provided in a same layer as the active layer 9, to facilitate simplification of process steps, and the electrostatic barrier line 2 and the active layer 9 may be made of a same material, that is, a semiconductor material, so that the resistivity of the electrostatic barrier line 2 is larger than the resistivity of the bonding electrode 1 made of a metal material. Exemplarily, the above-described electrostatic barrier line 2 may be made of doped polysilicon. For example, the above-described electrostatic barrier line 2 may be made of doped low-temperature polysilicon.

For example, in the embodiment of the present disclosure, that an A component is provided in a same layer as a B component refers to that: in a direction perpendicular to the base substrate, there is no other layer or structure between the A component and the B component. For example, in the embodiment of the present disclosure, that the A component and the B component are provided in a same layer and made of a same material refers to that: the A component and the B component are simultaneously formed by performing a same patterning process on a same thin film, so that in the direction perpendicular to the base substrate, there is no other layer or structure between the A component and the B component, and the A component and the B component are made of a material exactly the same.

Figure 4:
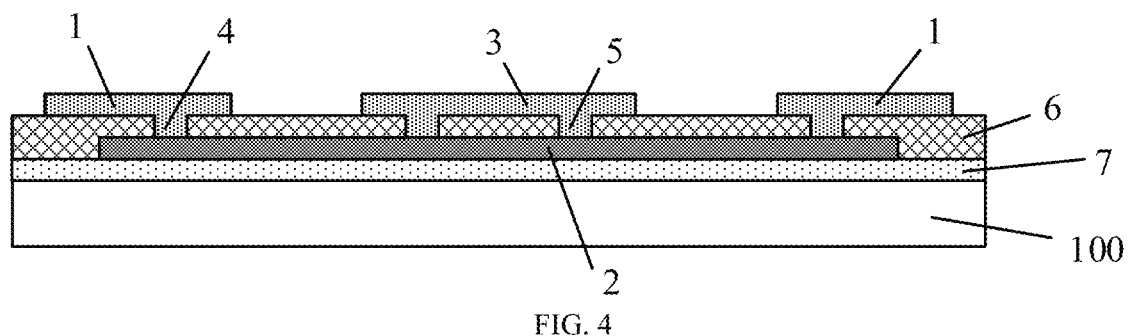
FIG. 4 is a cross-sectional structural view taken along a dashed line AA' of FIG. 1.
Figure 5:
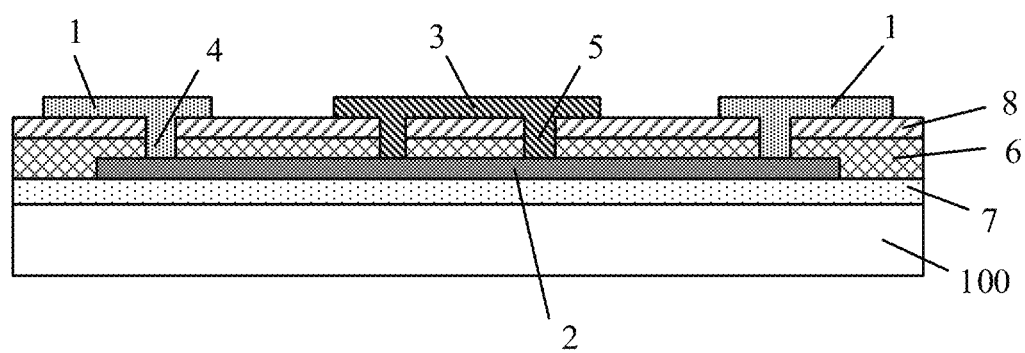
FIG. 5 is another cross-sectional structural view taken along the dashed line AA' of FIG. 1.
Figure 6A:
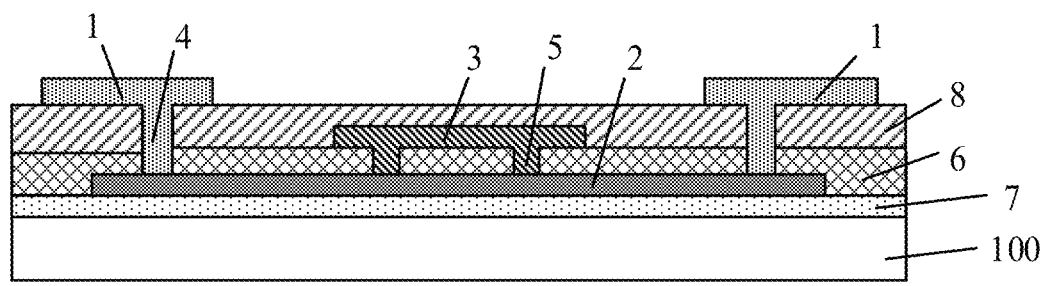
FIG. 6a is still another cross-sectional structural view taken along the dashed line AA' of FIG. 1.
Figure 6B:
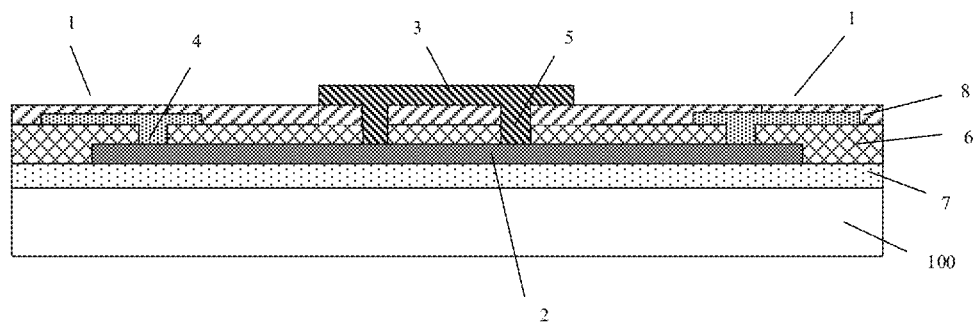
FIG. 6b is yet another cross-sectional structural view taken along the dashed line AA' of FIG. 1.
Figure 7:
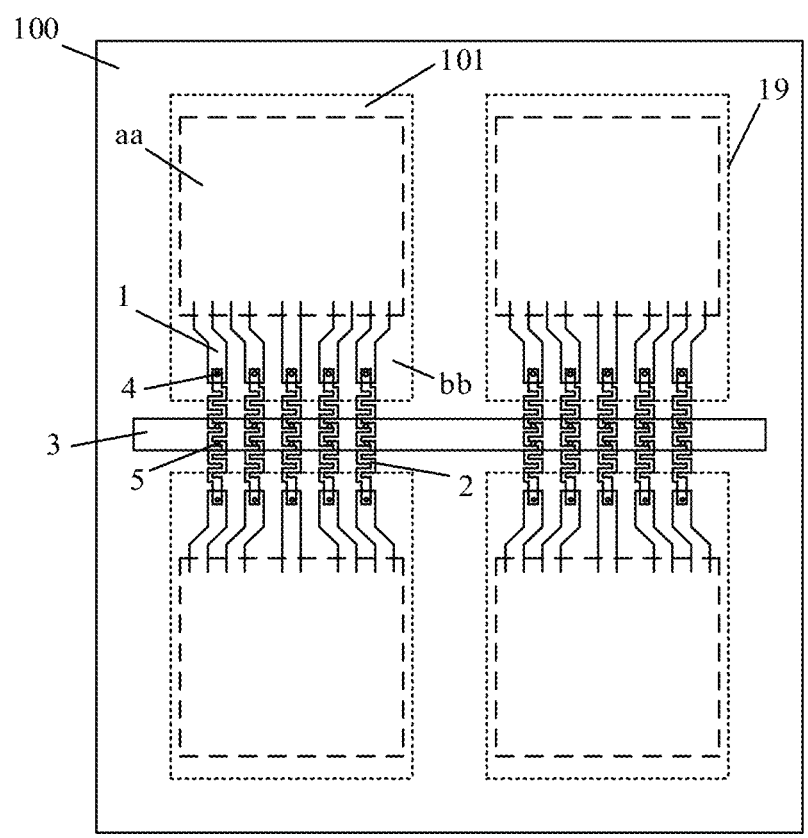
FIG. 7 is still another plan structural view of the array substrate motherboard provided by the embodiment of the present disclosure.

For example, as illustrated in FIG. 3 and FIG. 4, the bonding electrode 1 and the electrostatic protection line 3 may both be provided in the gate metal layer; the bonding electrode 1 may be electrically connected with the electrostatic barrier line 2 through a first via hole 4 provided in the gate insulating layer 6, and the electrostatic barrier line 2 may be electrically connected with the electrostatic protection line 3 through a second via hole 5 provided in the gate insulating layer 6. For example, as illustrated in FIG. 3 and FIG. 5, the bonding electrode 1 and the electrostatic protection line 3 may both be provided in the source/drain metal layer; the first via hole 4 and the second via hole 5 are provided in the gate insulating layer 6 and the interlayer insulating layer 8; the bonding electrode 1 may be electrically connected with the electrostatic barrier line 2 through the first via hole 4; and the electrostatic protection line 3 may be electrically connected with the electrostatic barrier line 2 through the second via hole 5. For example, as illustrated in FIG. 3 and FIG. 6a, the bonding electrode 1 may be provided in the source/drain metal layer, the electrostatic protection line 3 may be provided in the gate metal layer; the second via hole 5 is provided in the gate insulating layer 6, the first via hole 4 is provided in the gate insulating layer 6 and the interlayer insulating layer 8; the bonding electrode 1 is electrically connected with the electrostatic barrier line 2 through the first via hole 4, and the electrostatic protection line 3 is electrically connected with the electrostatic barrier line 2 through the second via hole 5. For example, as illustrated in FIG. 3 and FIG. 6b, the bonding electrode 1 may be provided in the gate metal layer, the electrostatic protection line 3 may be provided in the source/drain metal layer; the first via hole 4 is provided in the gate insulating layer 6, the second via hole 5 is provided in the gate insulating layer 6 and the interlayer insulating layer 8; the bonding electrode 1 is electrically connected with the electrostatic barrier line 2 through the first via hole 4, and the electrostatic protection line 3 is electrically connected with the electrostatic barrier line 2 through the second via hole 5. The above-described arrangements of the bonding electrode 1, the electrostatic barrier line 2 and the electrostatic protection line 3 are compatible with a preparation process of a specific structure in the array substrate motherboard, thus it is not necessary to additionally increase processes for preparing the bonding electrode 1, the electrostatic barrier line 2 and the electrostatic protection line 3, which simplifies the process steps. For example, the electrostatic barrier line 2 may be a fold line, a curved line or a straight line, alternatively, the electrostatic barrier line 2 may be a combination of at least two of a fold line, a curved line and a straight line. Exemplarily, as illustrated in FIG. 7 and FIG. 8, the electrostatic barrier line 2 is a fold line, so that a resistance value of the electrostatic barrier line 2 is increased by extending a length of the electrostatic barrier line 2, which, thus, can further alleviate damage to the internal structure of the array substrate 101 caused by static electricity.

In addition, it should be noted that, the array substrate motherboard according to the embodiment of the present disclosure is applicable to an organic light emitting diode (OLED) display device, accordingly, as illustrated in FIG. 3, the array substrate motherboard further comprises: a passivation layer 13, an anode 16, a pixel defining layer 15, an organic light-emitting layer 17 and a cathode 18. The anode 16 is connected to the drain electrode 12 through a via hole provided in the passivation layer 13.

In another embodiment of the present disclosure, there is provided a fabrication method of an array substrate motherboard, as illustrated in FIG. 10 to FIG. 14b.

For example, the array substrate motherboard comprises a plurality of array structures 101, each array structure 101 comprises a display region aa and a bonding region bb; the bonding region bb is provided with a bonding electrode 1, and the bonding electrode 1 is spaced apart from an outer edge of the bonding region bb. The fabrication method comprises: fabricating an electrostatic barrier line 2 in the bonding region bb, herein, the electrostatic barrier line 2 has one end electrically connected with the bonding electrode 1, and the other end extending to the outer edge of the bonding region bb, and resistivity of the electrostatic barrier line 2 is larger than resistivity of the bonding electrode 1. The electrostatic barrier line 2 can block external static electricity, and disperse static electricity on the bonding electrode 1 to a certain extent, which, thus, can alleviate damage to the internal structure of the array substrate 101 caused by the static electricity and alleviate damage to an internal structure of an array substrate caused by the static electricity while the array substrate is obtained by cutting the array substrate motherboard.

Figure 10:
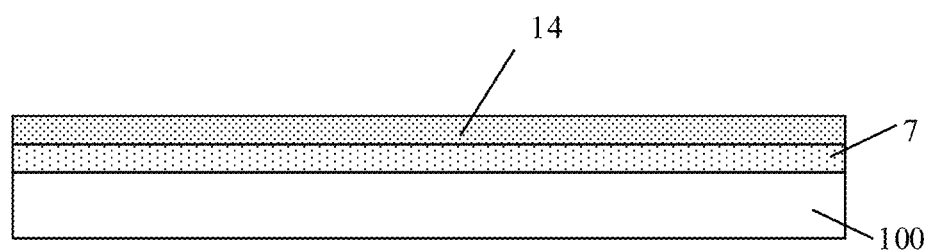
FIG. 10 to FIG. 14b are schematic diagrams of respective steps of a fabrication method of an array substrate motherboard provided by an embodiment of the present disclosure.

For example, the fabrication method of the array substrate motherboard may comprise steps of:

Step S1: as illustrated in FIG. 10, forming a semiconductor thin film 14 on a base substrate 100.

For example, in the case that the semiconductor thin film 14 is made of polysilicon, the above-described step S1 may be, for example, a process of: depositing an amorphous silicon thin film on the base substrate 100; and irradiating the amorphous silicon thin film with laser, to crystallize the amorphous silicon thin film, and obtain the semiconductor thin film 14 made of polysilicon.

For example, before the above-described step S1, the method may further comprise: forming a buffer layer 7 on the base substrate 100, such that impurities in the base substrate 100 are prevented from diffusing and entering the semiconductor thin film 14 by the buffer layer 7.

Figure 11A:
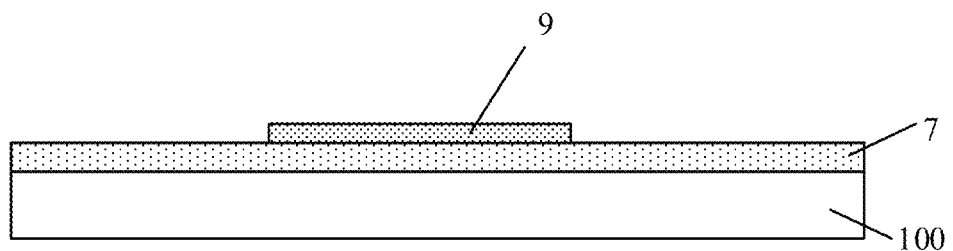
Figure 11B:
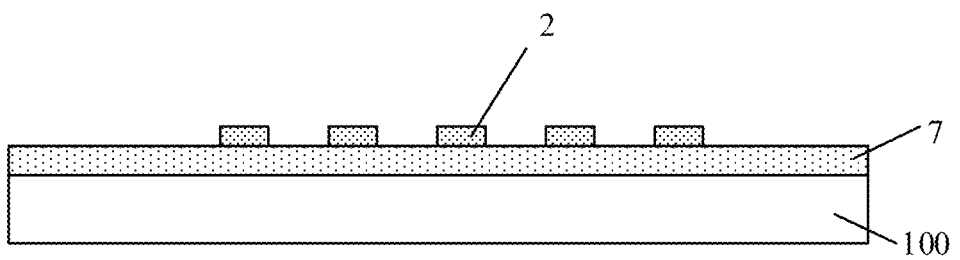

Step S2: as illustrated in FIG. 11a and FIG. 11b, patterning the above-described semiconductor thin film 14, to form an active layer 9 and the electrostatic barrier line 2.

Step S3: performing ion implantation on a source region and a drain region of the active layer 9 as well as the electrostatic barrier line 2, to improve electrical conductivity of the source region and the drain region of the active layer 9 as well as the electrostatic barrier line 2. For example, the source region and the drain region of the active layer 9 as well as the electrostatic barrier line 2 become electrically conductive by ion implantation.

Figure 12A:
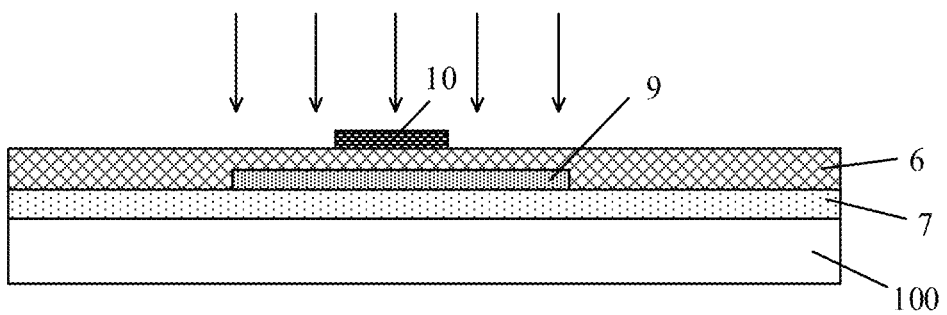
Figure 12B:
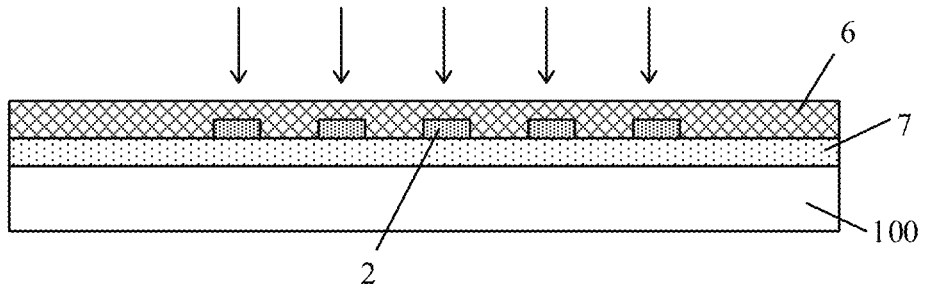
Figure 13A:
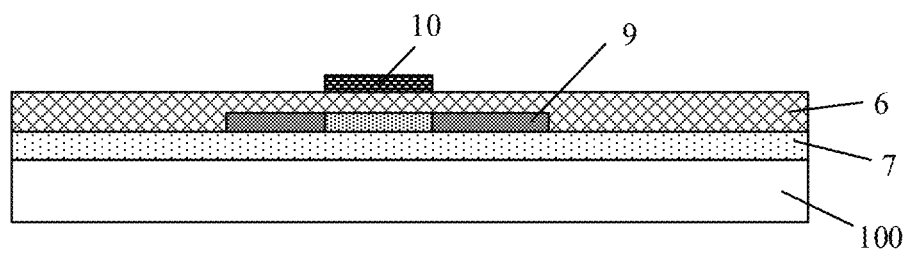
Figure 13B:
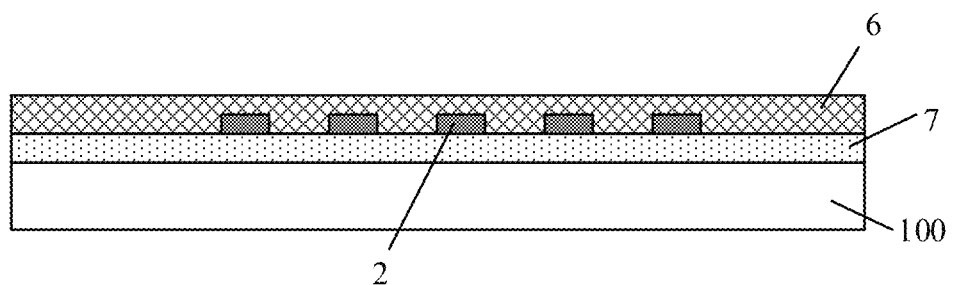

In the above-described step S3, ion implantation may be performed in one of two modes below:

Mode One: as illustrated in FIG. 12a and FIG. 12b, forming a gate insulating layer 6 on a side of the active layer 9 facing away from the base substrate 100 and the electrostatic barrier line 2 that faces away from the base substrate 100; forming a gate metal layer on a side of the gate insulating layer 6 that faces away from the base substrate 100; patterning the above-described gate metal layer to form a gate electrode 10; performing ion implantation on the source region and the drain region of the active layer 9 by using the gate electrode 10 as a mask, in which process, the electrostatic barrier line 2 is simultaneously ion-implanted, because no gate electrode 10 is disposed above the electrostatic barrier line 2. As illustrated in FIG. 13a and FIG. 13b, after ion implantation, the electrically conductive source region and drain region of the active layer 9 as well as the electrically conductive electrostatic barrier line 2 are obtained.

In the above-described Mode One, ion implantation is performed directly by using the gate electrode 10 as a mask, so that a step of additionally preparing a mask for ion implantation may be omitted, which saves a photoetching process, and achieves an effect of simplifying the process steps.

In addition, in the step of patterning the gate metal layer, an electrostatic protection line may be further formed; the electrostatic protection line is provided between the plurality of array structures 101; and the electrostatic barrier line 2 is electrically connected with the electrostatic protection line, so that a dispersion effect on static electricity is enhanced by the electrostatic protection line without additional process steps.

It should be noted that, the above-described Mode One is applicable to preparation of the array substrate motherboard of the "top gate" structure.

Mode Two: forming a photoresist layer on the side of the active layer 9 and the electrostatic barrier line 2 that faces away from the base substrate 100; patterning the photoresist layer, reserving the photoresist in a region between the source region and the drain region of the active layer 9, and making the source region and the drain region of the active layer 9 as well as the electrostatic barrier line 2 no longer covered by the photoresist so as to be exposed; performing ion implantation on the source region and the drain region of the active layer 9 as well as the electrostatic barrier line 2 by using a patterned photoresist layer as a mask, so that the source region and the drain region of the active layer 9 as well as the electrostatic barrier line 2 have electrical conductivity.

It should be noted that, the above-described Mode Two in which ion implantation is performed by directly forming the photoresist layer is applicable to preparation of the array substrate motherboard of the "bottom gate" structure, the "top gate" structure, or any other structure.

For example, the fabrication method may further comprise a step of preparing a source/drain metal layer. The bonding electrode and the electrostatic protection line may be formed in a same process step as the source/drain metal layer according to actual design requirements.

Figure 14A:
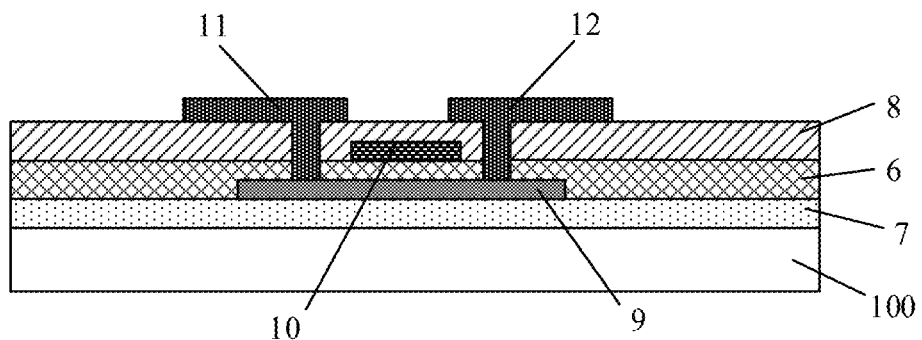
Figure 14B:
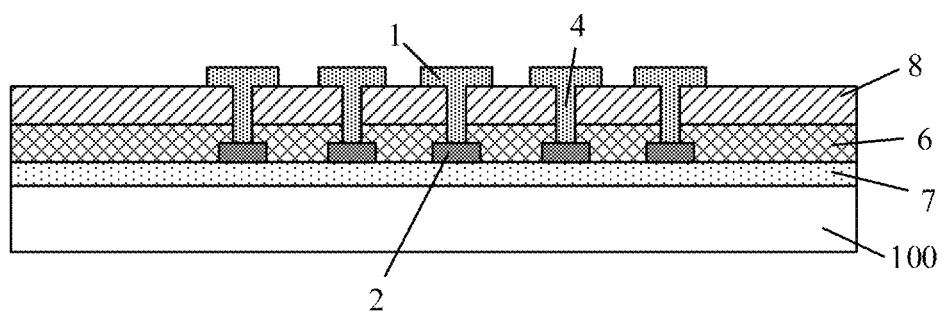

Exemplarily, as illustrated in FIG. 14a and FIG. 14b, the fabrication method may further comprise: forming an interlayer insulating layer 8 on a side of the gate electrode 10 that faces away from the base substrate 100; forming the source/drain metal layer on a side of the interlayer insulating layer 8 that faces away from the base substrate 100; and patterning the source/drain metal layer to form a source electrode 11, a drain electrode 12 and the bonding electrode 1. The source electrode 11 is electrically connected with the source region of the active layer 9 through a via hole; the drain electrode 12 is electrically connected with the drain region of the active layer 9 through a via hole; and the bonding electrode 1 is electrically connected with a corresponding electrostatic barrier line 2 through a first via hole 4.

Moreover, an electrostatic protection line is further formed, for example, in the above-described process of patterning the source/drain metal layer. The electrostatic protection line is electrically connected with the electrostatic barrier line 2 through a second via hole.

It should be noted that, in the embodiment of the present disclosure, FIG. 11a, FIG. 12a, FIG. 13a and FIG. 14a are cross-section structural views of the display region aa of the above-described array structure 101, and FIG. 11b, FIG. 12b, FIG. 13b and FIG. 14b are cross-section structural views of the bonding region bb of the above-described array structure 101.

Figure 15:
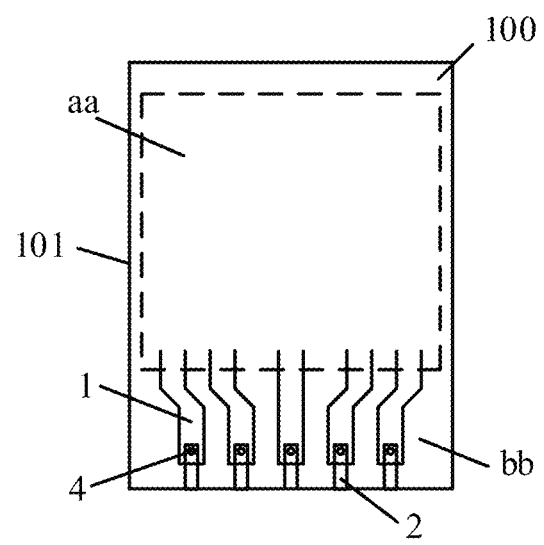
FIG. 15 is a plan structural view of an array substrate provided by an embodiment of the present disclosure.

With reference to FIG. 15, another embodiment of the present disclosure provides an array substrate, the array substrate comprises a display region aa and a bonding region bb, herein, the bonding region bb is provided with a bonding electrode 1, the bonding electrode 1 is spaced apart from an outer edge of the bonding region bb, the bonding region bb is further provided with an electrostatic barrier line 2, the electrostatic barrier line 2 has one end electrically connected with the bonding electrode 1, and the other end extending to the outer edge of the bonding region bb, and resistivity of the electrostatic barrier line 2 is larger than resistivity of the bonding electrode 1. Due to a blocking effect of the electrostatic barrier line 2 on external static electricity and a dispersion effect of the electrostatic barrier line 2 on internal static electricity, the problem of damage to the array substrate caused by the static electricity is solved.

For example, in a direction parallel to the array substrate, the bonding electrode 1 is spaced apart from the outer edge of the bonding region bb.

For example, the bonding region bb has the outer edge and an inner edge, and the inner edge of the bonding region bb is located between the display region aa and the outer edge of the bonding region bb. Therefore, the outer edge of the bonding region bb is an edge of the bonding region bb that is close to the edge of the array substrate. For example, the outer edge of the bonding region bb is flush with the edge of the array substrate.

For example, there are a plurality of bonding electrodes 1 and a plurality of electrostatic barrier lines 2, and the plurality of bonding electrodes 1 are electrically connected with the plurality of electrostatic barrier lines 2 in a one-to-one manner.

For example, as illustrated in FIG. 3, the above-described array substrate may comprise: a base substrate 100, a buffer layer 7, an active layer 9, a gate insulating layer 6, a gate metal layer, an interlayer insulating layer 8 and a source/drain metal layer; the gate metal layer comprising a gate electrode 10, and the source/drain metal layer comprising a source electrode 11 and a drain electrode 12.

As illustrated in FIG. 3, FIG. 4, FIG. 5 and FIG. 6, the electrostatic barrier line 2 may be provided in a same layer as the active layer 9, to facilitate simplification of process steps, and the electrostatic barrier line 2 and the active layer 9 are made of a same material, that is, a semiconductor material, so that the resistivity of the electrostatic barrier line 2 is larger than the resistivity of the bonding electrode 1 made of a metal material. Exemplarily, the above-described electrostatic barrier line 2 may be made of doped polysilicon. Exemplarily, the above-described electrostatic barrier line 2 may be made of doped low-temperature polysilicon.

In the structure illustrated in FIG. 3, the gate electrode 10 is located on a side of the active layer 9 that faces away from the base substrate 100, and such a structure is referred to as a "top gate" structure. Based on the structure and as illustrated in FIG. 4, the bonding electrode 1 may be provided in the gate metal layer, the first via hole 4 is provided in the gate insulating layer 6, and the bonding electrode 1 is electrically connected with the electrostatic barrier line 2 through the first via hole 4. For example, with reference to FIG. 5, the bonding electrode 1 may be provided in the source/drain metal layer, the first via hole 4 is provided in the gate insulating layer 6 and the interlayer insulating layer 8, and the bonding electrode 1 is electrically connected with the electrostatic barrier line 2 through the first via hole 4.

It should be noted that, a position of the bonding electrode 1 and a connection structure between the bonding electrode 1 and the electrostatic barrier line 2 are introduced above merely with a case where the array structure 101 has the "top gate" structure as an example; with respect to the array structure 101 having a "bottom gate" structure, the bonding electrode 1 may also be provided in the gate metal layer or the source/drain metal layer, and no details will be repeated here.

For example, the electrostatic barrier line 2 may be a fold line, a curved line and a straight line, alternatively, it may be a combination of at least two of a fold line, a curved line and a straight line. Exemplarily, as illustrated in FIG. 7 and FIG. 8, the electrostatic barrier line 2 is a fold line, so that a resistance value of the electrostatic barrier line 2 is increased by extending a length of the electrostatic barrier line 2, which, thus, may further alleviate damage to the internal structure of the array substrate caused by static electricity.

It should be noted that, the array substrate provided by the embodiment of the present disclosure is obtained by cutting the array substrate motherboard along a cutting line. Exemplarily, with reference to FIG. 1, after the array substrate motherboard is cut along a cutting line 19, a plurality of array substrates as illustrated in FIG. 15 can be obtained. For example, after the cutting, the electrostatic protection line 3 on the array substrate motherboard is cut off, so the electrostatic protection line 3 is not present on the array substrate obtained.

In still another embodiment of the present disclosure, there is further provided a display device, the display device comprising the display panel provided by the embodiment of the present disclosure. As described above, the display panel comprises the array substrate provided by the embodiment of the present disclosure, so the display device that comprises the display panel also has same advantageous effects as the array substrate described above.

In still another embodiment of the present disclosure, there is further provided a display device, the display device comprising the array substrate provided by the embodiment of the present disclosure. As described above, the display device comprises the array substrate provided by the embodiment of the present disclosure, so the display device also has same advantageous effects as the array substrate described above.

The display device according to the embodiment of the present disclosure may be a display panel, a mobile phone, a tablet personal computer, a television, a monitor, a laptop, a digital photo frame, a navigator, and any other product or component having a display function.

For specific details of the fabrication method of the array substrate, the fabrication method of the array substrate motherboard as described above may be referred to, and no details will be repeated here. For example, after fabrication of the array substrate motherboard is completed, the array substrate according to the embodiment of the present disclosure may be obtained by just cutting the array substrate motherboard. For example, one array structure of the array substrate motherboard is used to form one array substrate.

What is described above is related to the illustrative embodiments of the disclosure only and not limitative to the scope of the disclosure; the scopes of the disclosure are defined by the accompanying claims.

What is claimed is:

1. An array substrate, comprising a display region and a bonding region located outside the display region, the array substrate further comprising:
    a bonding electrode, located in the bonding region and spaced apart from an outer edge of the bonding region, wherein part of the bonding electrode extends along a first direction parallel to a plane of the array substrate;
    a base substrate and an active layer located on the base substrate, wherein an electrostatic barrier line and the active layer are provided in a same layer and made of a same material;
    a source/drain metal layer and a gate metal layer located on the base substrate, wherein the bonding electrode and the source/drain metal layer are provided in a same layer and made of a same material; or the bonding electrode and the gate metal layer are provided in a same layer and made of a same material; and
    the electrostatic barrier line, comprising one end electrically connected with a second end of the bonding electrode, and the other end extending to the outer edge of the bonding region, and resistivity of the electrostatic barrier line is larger than resistivity of the bonding electrode,
    wherein the electrostatic barrier line is located outside the display region and on a side of the bonding electrode facing away from the display region, and the electrostatic barrier line is configured to prevent static electricity from entering inside of the array substrate from an edge of the array substrate,
    wherein the electrostatic barrier line entirely extends along the first direction.

2. The array substrate according to claim 1, wherein the array substrate comprises a plurality of bonding electrodes and a plurality of electrostatic barrier lines, and the plurality of bonding electrodes are electrically connected with the plurality of electrostatic barrier lines in one-to-one manner.

3. The array substrate according to claim 1, wherein:
    the source/drain metal layer is provided on a side of the active layer that faces away from the base substrate, and the gate metal layer is provided between the active layer and the source/drain metal layer;
    the array substrate further comprises a gate insulating layer provided between the active layer and the gate metal layer, and an interlayer insulating layer provided between the gate metal layer and the source/drain metal layer;
    the bonding electrode and the source/drain metal layer are provided in a same layer and made of a same material, and a first via hole is provided in the gate insulating layer and the interlayer insulating layer; or, the bonding electrode and the gate metal layer are provided in a same layer and made of a same material, and a first via hole is provided in the gate insulating layer; and
    the bonding electrode is electrically connected with the electrostatic barrier line through the first via hole.

4. The array substrate according to claim 1, wherein the electrostatic barrier line comprises at least one of a fold line, a curved line or a straight line.

5. A display device, comprising an array substrate, the array substrate comprising a display region and a bonding region located outside the display region, the array substrate further comprising:
    a bonding electrode, located in the bonding region and spaced apart from an outer edge of the bonding region, wherein part of the bonding electrode extends along a first direction parallel to a plane of the array substrate;
    a base substrate and an active layer located on the base substrate, wherein an electrostatic barrier line and the active layer are provided in a same layer and made of a same material;
    a source/drain metal layer and a gate metal layer located on the base substrate, wherein the bonding electrode and the source/drain metal layer are provided in a same layer and made of a same material; or the bonding electrode and the gate metal layer are provided in a same layer and made of a same material; and
    the electrostatic barrier line has comprising one end electrically connected with a second end of the bonding electrode, and the other end extends extending to the outer edge of the bonding region, and resistivity of the electrostatic barrier line is larger than resistivity of the bonding electrode,
    wherein the electrostatic barrier line is located outside the display region and on a side of the bonding electrode facing away from the display region, and the electrostatic barrier line is configured to prevent static electricity from entering inside of the array substrate from an edge of the array substrate, wherein the electrostatic barrier line entirely extends along the first direction.

6. A fabrication method of an array substrate, the array substrate comprising a display region and a bonding region outside the display region, the fabrication method comprising:

forming a bonding electrode, the bonding electrode is located in the bonding region and spaced apart from an outer edge of the bonding region; and forming an electrostatic barrier line, the electrostatic barrier line comprises one end electrically connected with the bonding electrode, and the other end extending to the outer edge of the bonding region, and resistivity of the electrostatic barrier line is larger than resistivity of the bonding electrode, wherein the electrostatic barrier line is located outside the display region and on a side of the bonding electrode facing away from the display region, and the electrostatic barrier line is configured to prevent static electricity from entering inside of the array substrate from an edge of the array substrate, wherein the fabrication method further comprises:
forming a semiconductor thin film on a base substrate;
patterning the semiconductor thin film to form an active layer and the electrostatic barrier line;
performing ion implantation on a source region and a drain region of the active layer as well as the electrostatic barrier line, wherein after the patterning the semiconductor thin film and before the performing ion implantation, the fabrication method further comprises:

forming a gate insulating layer on a side of the active layer and the electrostatic barrier line that faces away from the base substrate;

forming a gate metal layer on a side of the gate insulating layer that faces away from the base substrate;

patterning the gate metal layer to form a gate electrode, and wherein the performing ion implantation comprises: performing ion implantation by using the gate electrode as a mask:

forming the bonding electrode at a same time of patterning the gate metal layer to form the gate electrode; and the fabrication method further comprises: forming a first via hole in the gate insulating layer, the bonding electrode is electrically connected with the electrostatic barrier line through the first via hole.

7. The fabrication method of the array substrate according to claim 6, further comprising:

forming an interlayer insulating layer on a side of the gate electrode that faces away from the base substrate;

forming a source/drain metal layer on a side of the interlayer insulating layer that faces away from the base substrate;

patterning the source/drain metal layer to form a source electrode, a drain electrode and the bonding electrode; and forming a first via hole in the interlayer insulating layer and the gate insulating layer, the bonding electrode is electrically connected with the electrostatic barrier line through the first via hole.

* * * * *